United States Patent [19]

Poppert et al.

[11] Patent Number: 4,693,783
[45] Date of Patent: Sep. 15, 1987

[54] METHOD OF PRODUCING INTERCONNECTIONS IN A SEMICONDUCTOR INTEGRATED CIRCUIT STRUCTURE

[75] Inventors: Paul E. Poppert, Acton; Marvin J. Tabasky, Peabody, both of Mass.

[73] Assignee: GTE Laboratories Incorporated, Waltham, Mass.

[21] Appl. No.: 687,705

[22] Filed: Dec. 31, 1984

[51] Int. Cl.⁴ .................. B23P 15/00; B23P 25/06
[52] U.S. Cl. .................... 156/644; 156/651; 156/659.1
[58] Field of Search ............... 156/643, 649, 656, 644, 156/648, 651, 659.1; 427/82, 86, 88, 97

[56] References Cited

U.S. PATENT DOCUMENTS 4,354,897 10/1982 Nakajima .......................... 156/651
4,381,341  4/1983 Przybysz et al. .................. 156/651
4,472,240  9/1984 Kameyama ....................... 156/651
4,518,629  5/1985 Jeuch ................................ 156/644
4,526,631  7/1985 Silvestri et al. ................... 156/644
4,528,065  7/1985 Yamazaki ......................... 156/656
4,544,441 10/1985 Hartmann et al. ................ 156/656
4,550,353 10/1985 Hirai et al. ........................ 156/656
4,582,563  4/1986 Hazuki et al. .................... 156/659.1

Primary Examiner—S. Leon Bashore
Assistant Examiner—Michael K. Boyer
Attorney, Agent, or Firm—David M. Keay

[57] ABSTRACT

Method of producing metal interconnections in a semiconductor integrated circuit structure of a body of silicon coated with silicon dioxide having openings therein exposing contact regions to underlying silicon. A thick layer of an insulating or dielectric material, for example, polymide, is deposited on the body. Grooves in the pattern of the desired interconnections are etched through the thick insulating layer to the underlying silicon dioxide and contact regions. Metal is deposited to fill the grooves and cover the thick layer of insulating material. Excess metal is removed to form a planar surface exposing the surface of the thick insulating layer with the grooves containing metal to provide electrical connections between contact regions.

9 Claims, 8 Drawing Figures

METHOD OF PRODUCING INTERCONNECTIONS IN A SEMICONDUCTOR INTEGRATED CIRCUIT STRUCTURE

BACKGROUND OF THE INVENTION

This invention relates to semiconductor integrated circuit structures. More particularly, it is concerned with electrical interconnections between elements of semiconductor integrated circuits.

As improvements have been made in the techniques of fabricating semiconductor integrated circuits it has been possible to produce elements with closer tolerances permitting elements to be of smaller size, thus making more efficient use of the semiconductor wafer. The width of metallic interconnections between elements can also be reduced. The resulting smaller cross-sectional areas of the metallic interconnections decreases their electrical conductance and tends to reduce overall circuit performance. Compensating by increasing the thickness of the deposited metallic interconnections introduces various difficulties. Mechanical strain in the metallic structure may cause peeling of the metal from the surface of the wafer. Thick layers of metal are difficult to etch with sufficient precision so as to maintain the lateral relationships. Steep vertical steps in the metallic interconnections are difficult to cover in a reliable manner with insulating layers. Furthermore, the uneven steps of the non-planar surface present difficulties in obtained proper alignment and definition when employing photolithographic processes.

SUMMARY OF THE INVENTION

The method in accordance with the present invention for producing improved interconnections in a semiconductor integrated circuit structure comprises providing a body of semiconductor material having a surface covered by a coating of adherent nonconductive protective material with contact regions interspersed therein. A thick layer of adherent insulating material is deposited on the coating. Grooves are formed in the thick layer of adherent insulating material to a depth so as to expose portions of the contact regions. Conductive material is deposited on the body to fill the grooves and to cover the thick layer of adherent insulating material. Then, conductive material is removed to expose the underlying thick layer of adherent insulating material leaving conductive material in the grooves providing electrical connections between contact regions.

In accordance with another aspect of the present invention, a semiconductor integrated circuit structure comprises a body of semiconductor material having a surface covered by a coating of adherent nonconductive protective material with contact regions interspersed therein. A thick layer of adherent insulating material having a surface spaced from the coating overlies the coating. Conductive material is inset in grooves in the thick layer of adherent insulating material and extends from the surface of the thick layers to the contact regions so as to provide electrical connections between contact regions.

In the figures the various elements are not drawn to scale. Certain dimensions are exaggerated in relation to other dimensions in order to present a clearer understanding of the invention.

For a better understanding of the present invention, together with other and further objects, advantages, and capabilities thereof, reference is made to the following disclosure and appended claims in connection with the above-described drawings.

DETAILED DESCRIPTION OF THE INVENTION

Monolithic semiconductor integrated circuit structures are fabricated on a wafer or slice of single crystal semiconductor material. As is well-understood, the slice or wafer is usually of relatively large surface area upon which many identical circuit networks each including many devices are fabricated simultaneously. However, for purposes of illustration a fragment of a slice of semiconductor material is shown and described herein. In the following description silicon is employed as the semiconductor material.

Figure 1:
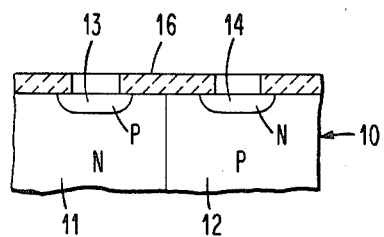
FIGS. 1, 2, 3, 4, and 5 are a series of elevational views in cross section of a fragment of a wafer of semiconductor material illustrating the fragment at various stages during the fabrication of conductive interconnections therein in accordance with the present invention.
Figure 1A:
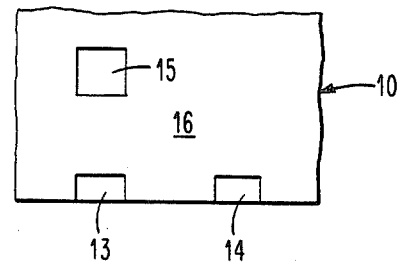
FIGS. 1A, 3A, and 5A are plan views of the fragment as illustrated in FIGS. 1, 3, and 5, respectively.

FIGS. 1 and 1A illustrate a fragment 10 of single crystal silicon having a first section 11 of N-type conductivity and a second section 12 of P-type conductivity. Inset in the surface of the N-type section 11 is a P-type region 13 and inset in the P-type section 12 is an N-type region 14. The flat, planar surface of the slice is covered by an adherent protective layer or coating of silicon dioxide 16 having openings therein exposing portions of the surface areas of the P-type region 13 and the N-type region 14. The arrangement of regions of different conductivity type within the fragment as illustrated in the figures is exemplary only for purposes of describing the present invention. The adherent protective coating 16 may be of any suitable dielectric material, for example silicon dioxide, silicon nitride, or silicon dioxide and silicon nitride. The openings in the protective coating 16 expose contact regions 13, 14, and 15 which may be the silicon surface, a silicided surface, or a metal contact.

Figure 2:
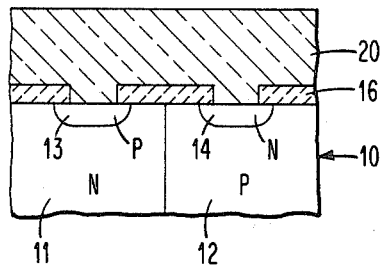

As illustrated in FIG. 2 a thick layer of an insulating or dielectric material 20 is chemically vapor deposited over the surface of the fragment covering the protective coating 16 and the contact regions 13, 14, and 15. The deposited insulating material 20 may be any of various dielectric materials, a preferred material being polyimide.

Figure 3:
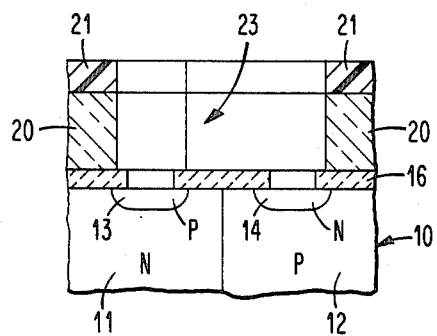
Figure 3A:
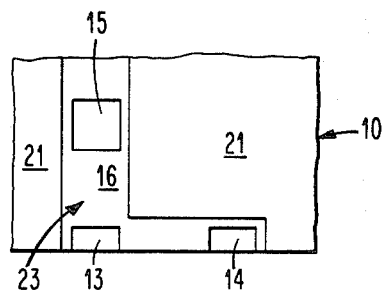

As illustrated in FIGS. 3 and 3A a photoresist material 21 is applied to the surface of the insulating layer 20. By employing suitable photolithographic techniques portions of the photoresist material are removed to provide a layer 21 of photoresist material overlying the insulating layer 20 in the desired pattern of electrical interconnections. The fragment is then subjected to a selective etching procedure as by reactive ion etching so as to remove the material 20 not protected by the photoresist material 21. The etching proceeds vertically without undercutting. The etching procedure is selective having no significant effect on the adherent protective coating 16 or material at the contact regions 13, 14, and 15. Thus, grooves 23 are formed in the dielectric layer 20 which expose portions of the protective coating 16 and also the contact regions 13, 14, and 15. The grooves 23 may be about one micron in width. The thickness of the dielectric layer 20, and consequently the depth of the grooves 23, is desirably greater than three microns and preferably between three and five microns.

Figure 4:
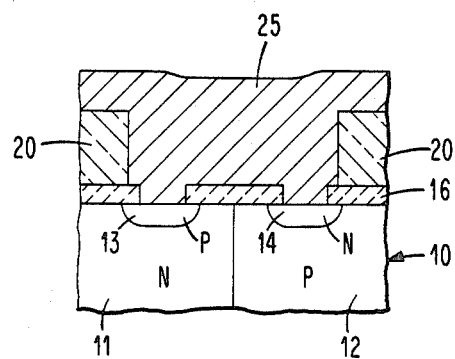
Figure 5:
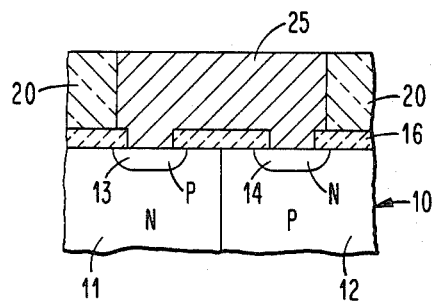
Figure 5A:
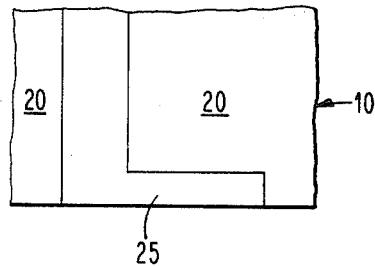

As illustrated in FIG. 4 the photoresist material 21 is removed from the fragment, and a conductive material 25 preferably a metal, for example aluminum, is deposited in the grooves and over the surface of the insulating material 20. By employing suitable etching techniques which produce a planar surface, the excess metal 25 over the insulating material 20 is removed as illustrated in FIGS. 5 and 5A. The resulting metal interconnections 25 which make contact with the contact regions 13, 14, and 15 have an upper surface which is coplanar with the upper surface of the insulating material 20.

Thus, highly conductive interconnections 25 which have relatively large cross-sectional area to provide high conductance are fabricated to interconnect the various contact regions, such as regions 13, 14, and 15. In addition a planar surface is produced at the upper surface of the fragment simplifying further processing. Additional layer of insulating material, which are compatible with those already employed, and other layers of metallization may be applied to provide sets of interconnections between those as illustrated in the figures. The additional layers of interconnections may be fabricated employing the teachings herein or, if appropriate, using conventional techniques.

While there has been shown and described what is considered a preferred embodiment of the present invention, it will be obvious to those skilled in the art that various changes and modifications may be made therein without departing from the invention as defined in the appended claims.

What is claimed is:

1. The method of producing electrical interconnections between contact regions in a semiconductor integrated circuit structure comprising
   providing a body of semiconductor material having a surface covered by a coating of adherent nonconductive protective material which contact regions interspersed therein;
   depositing a layer of adherent insulating material on said coating;
   forming grooves in said layer of adherent insulating material in the desired pattern of electrical connections between contact regions to a depth to expose portions of said contact regions;
   depositing conductive material on said body to fill said grooves and cover said layer of adherent insulating material; and
   removing all the conductive material overlying the layer of adherent insulating material to expose the underlying layer of adherent insulating material leaving said conductive material only filling the grooves and providing electrical connections in said desired pattern between contact regions.

2. The method in accordance with claim 1 wherein said coating of adherent nonconductive protective material and said layer of adherent insulating material are of different materials.

3. The method in accordance with claim 2 wherein the step of removing the conductive material includes etching to leave conductive material only filling the grooves and having a surface which is coplanar with the exposed surface of the layer of insulating material.

4. The method in accordance with claim 3 wherein said semiconductor material is silicon;
   said coating of adherent nonconductive protective material
      is selected from the group consisting of silicon dioxide, silicon nitride, or silicon dioxide and silicon nitride; and
   said conductive material is a metal.

5. The method in accordance with claim 4 wherein forming grooves in said layer of adherent insulating material includes
   forming grooves having a width such that the depth of the
      grooves is at least three times the width of said grooves.

6. The method in accordance with claim 4 wherein the step of forming grooves in said layer of adherent insulating material includes
   covering the layer of adherent insulating material with a layer of resist material having openings therein exposing portions of the layer in the pattern of said grooves; and
   reactive ion etching the exposed portions of said layer of adherent insulating material to a depth to expose underlying adherent nonconductive protective material of said coating and said portions of said contact regions.

7. The method in accordance with claim 6 wherein said step of reactive ion etching selectively etches said layer of adherent insulating material with respect to said coating of adherent nonconductive protective material and said contact regions.

8. The method in accordance with claim 7 wherein forming grooves in said layer of adherent insulating material includes
   forming grooves having a width such that the depth of the
      grooves is between three and five times the width of said grooves.

9. The method in accordance with claim 8 wherein depositing a layer of adherent insulating material includes
   depositing a layer of adherent insulating material between 3 and 5 microns thick.

* * * * *